United States Patent [19]

Matthews

[11] Patent Number: 5,125,451
[45] Date of Patent: Jun. 30, 1992

[54] HEAT EXCHANGER FOR SOLID-STATE ELECTRONIC DEVICES

[75] Inventor: James A. Matthews, Milpitas, Calif.

[73] Assignee: MicroUnity Systems Engineering, Inc., Sunnyvale, Calif.

[21] Appl. No.: 679,529

[22] Filed: Apr. 2, 1991

[51] Int. Cl.$^5$ .............................................. F28F 7/02
[52] U.S. Cl. ................................... 165/80.4; 165/167; 165/185; 361/385
[58] Field of Search .................... 165/80.4, 166, 167, 165/168, 185; 361/385

[56] References Cited

U.S. PATENT DOCUMENTS

| | | | |
|---|---|---|---|
| 3,361,195 | 1/1968 | Meyerhoff et al. | 165/80.4 |
| 3,454,082 | 7/1969 | Harke | 165/166 |
| 4,109,707 | 8/1978 | Wilson et al. | 165/46 |
| 4,151,548 | 4/1979 | Klein et al. | 357/82 |
| 4,450,472 | 5/1984 | Tuckerman et al. | 357/82 |
| 4,567,505 | 1/1986 | Pease et al. | 357/81 |
| 4,573,067 | 2/1986 | Tuckerman et al. | 357/82 |
| 4,975,803 | 12/1990 | Niggemann | 361/385 |

FOREIGN PATENT DOCUMENTS 3415554 10/1984 Fed. Rep. of Germany ...... 165/185

OTHER PUBLICATIONS

"Heat-Tranfer Microstructures for Integrated Circuits", by David Tuckerman prepared under Semiconductor Research Corp.-Grant No. SRC82-11-0002: Stanford University, Stanford, California; Feb. 1984.

Primary Examiner—Allen J. Flanigan
Attorney, Agent, or Firm—Blakely, Sokoloff, Taylor & Zafman

[57] ABSTRACT

A microscopic laminar-flow heat exchanger, well-suited for cooling a heat generating device such as a semiconductor integrated circuit, includes a plurality of thin plates, laminated together to form a block. Each plate has a microscopic recessed portion etched into one face of the plate and a pair of holes cut through the plate such that when the block is formed, the holes align to form a pair of coolant distribution manifolds. The manifolds are connected via the plurality of microscopic channels formed from the recessed portions during the lamination process. Coolant flow through these channels effectuates heat removal.

21 Claims, 4 Drawing Sheets

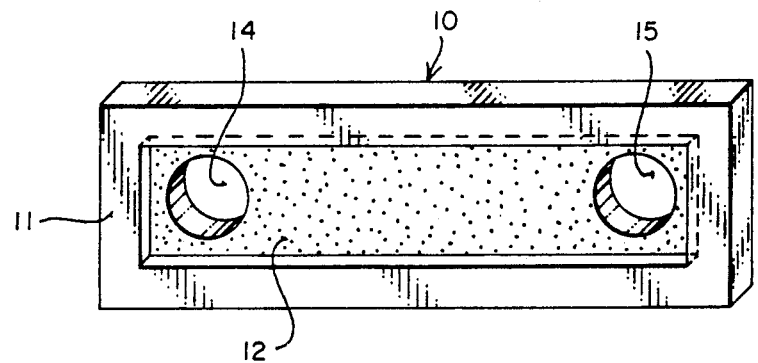
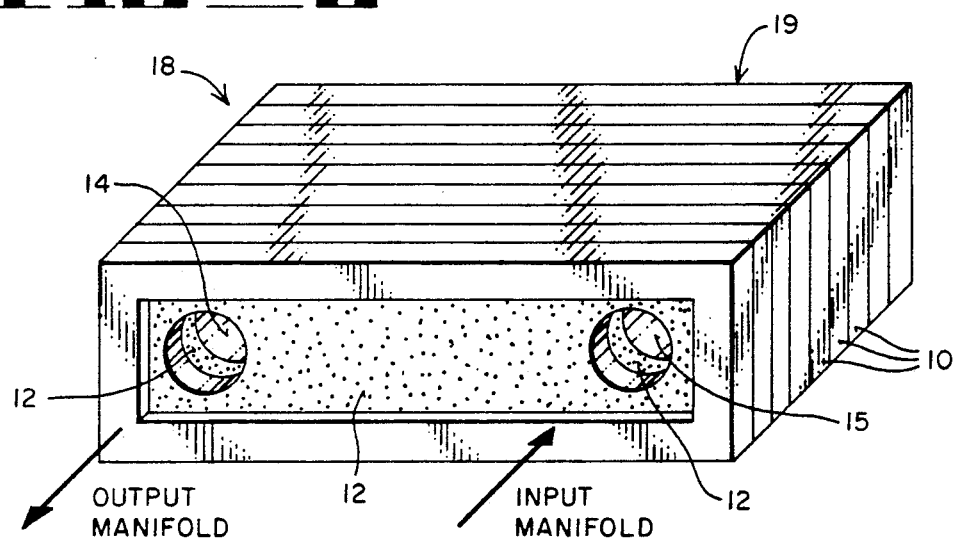
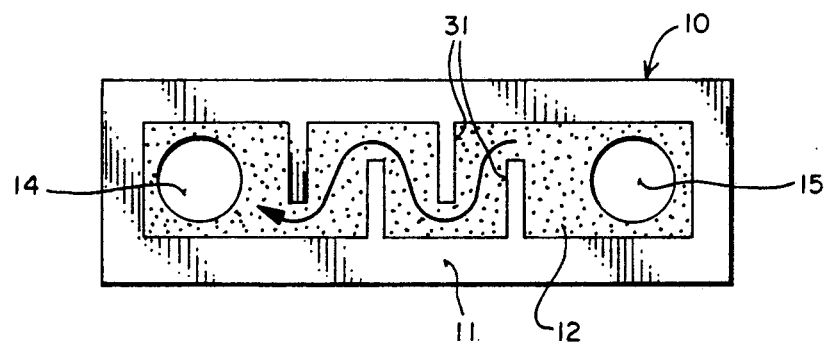

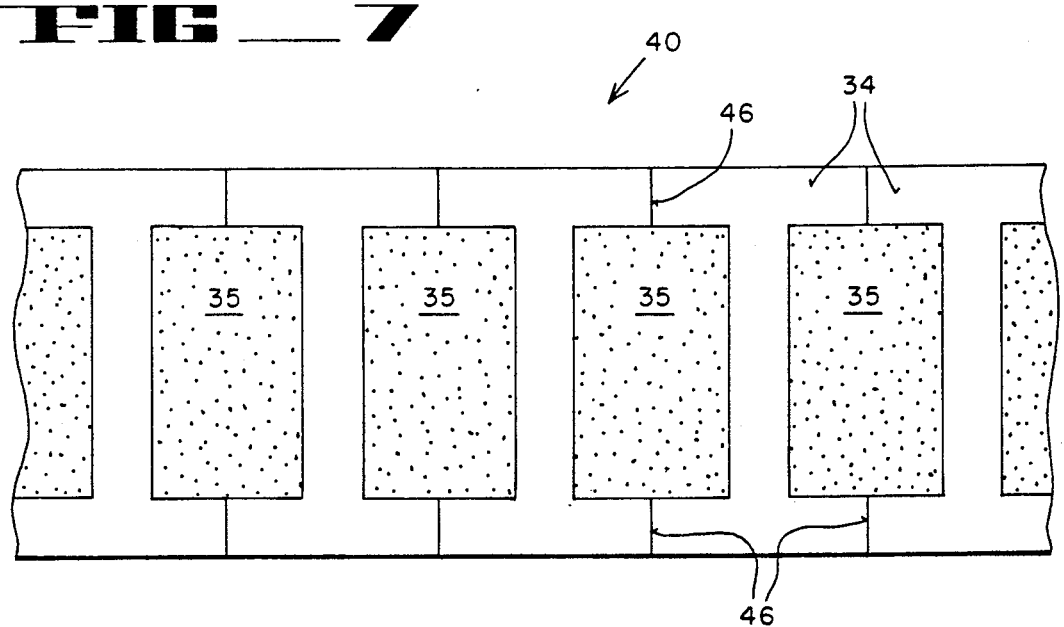

FIG_5A
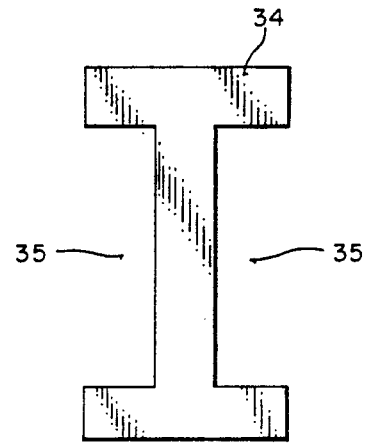
FIG_5B
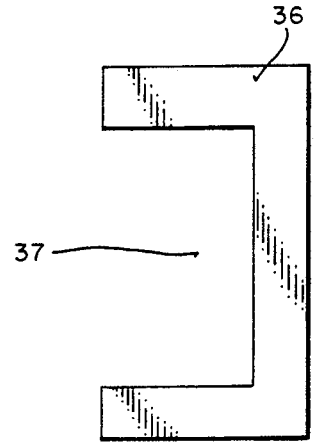
FIG_6
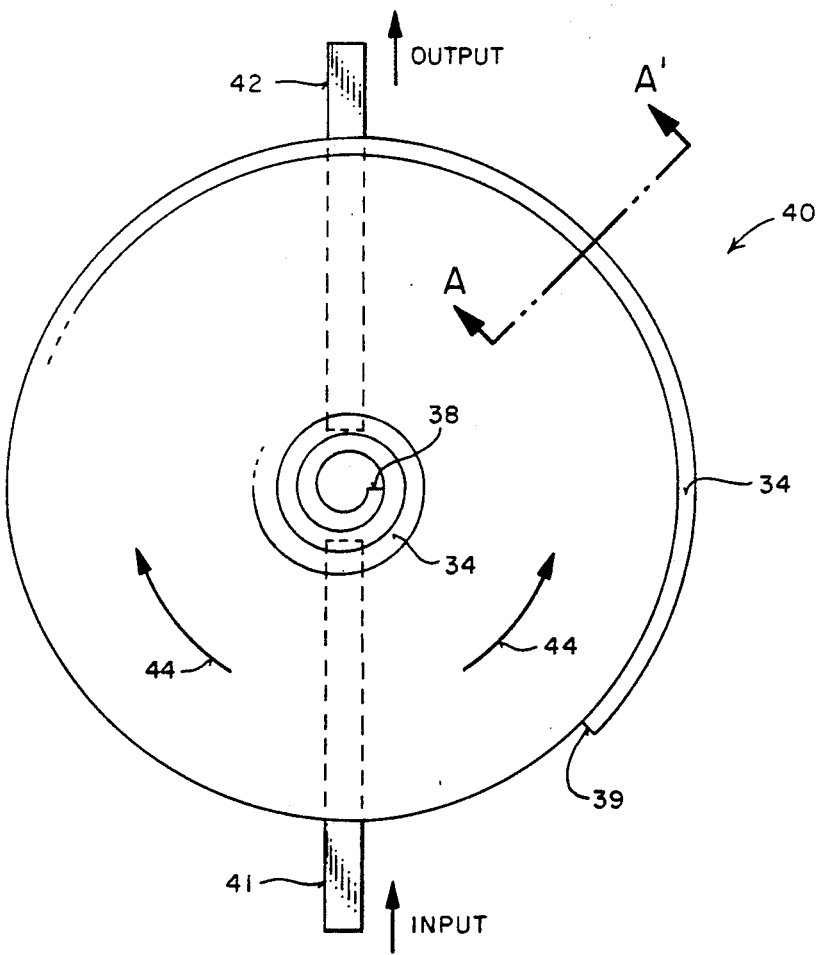

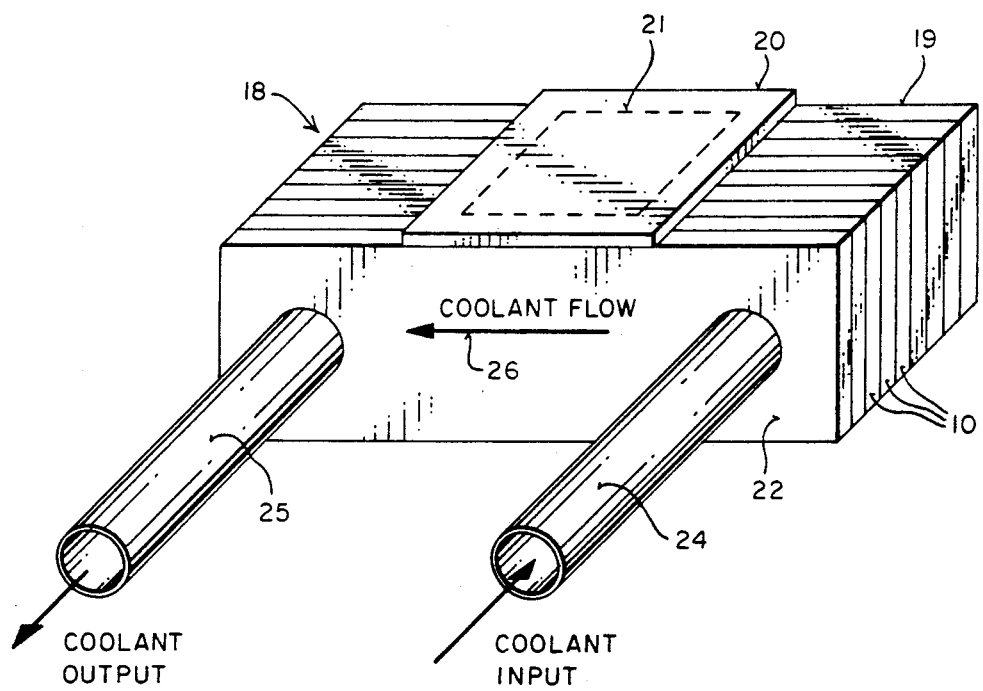

HEAT EXCHANGER FOR SOLID-STATE ELECTRONIC DEVICES

FIELD OF THE INVENITON

The invention relates generally to the field of heat exchanging devices; particularly to devices and methods aimed at removing heat from solid-state electronic circuits and the like.

BACKGROUND OF THE INVENTION

Ever since the integrated cirucit was first introduced several decades ago, there has been a continuing effort in the related fields of semiconductor processing and integrated circuit design to scale device sizes downward. Of course, the purpose of this effort has been to increase circuit density. Today, the density of components in very large scale integrated circuits (VLSI) is so enormous that further scaling of circuit components is constrained in part by thermal considerations. In other words, heat dissipation and removal have now become an important physical problem which influences the performance and design of most modern computer systems.

By way of example, the heat generated by a single high-speed emitter-coupled-logic gate (ECL) is typically on the order of a few milliwatts. Other logic families such as complementary metal-oxide semiconductor (CMOS) logic dissipate energy at reduced levels. Unfortunately, when hundreds of thousands of these logic gates are fabricated together on a single integrated circuit the total power consumption can easily reach the kilowatt level, especially if high-performance logic gates are used.

Even if a low-power logic family is used, a complete digital computer system may include tens of millions of transistors fabricated on hundreds of individual semiconductor chips. Because these chips are often packed closely together to minimize signal propagation delay, it is not uncommon for a computer system to generate tens or hundreds of kilowatts. At these power levels the operating temperature of the integrated circuits themselves can rise well above 120 degrees Celsius; such temperatures can cause serious reliability problems. Consequently, the use of various devices such as heat sinks, fans, special materials, etc., is necessary to alleviate the heat dissipation problem.

Addressing this problem, U.S. Pat. Nos. 4,450,472, 4,573,067 of Tuckerman et al., and 4,567,505 of Pease et al., each describe a heat sink in which microscopic heat fins are formed into the backside of a semiconductor substrate. The top surface of the substrate houses an integrated circuit. According to Tuckerman, the heat fins are fabricated integrally—into the semiconductor die itself—employing such techniques as chemical etching, laser scribing, reactive ion etching, electro-plating, or ultra fine sawing of the backside of the silicon die. Water is then pumped through these slots to provide a laminar flow which cools the die.

Theoretically, Tuckerman's approach does provide a means for efficiently removing heat from an integrated circuit. However from a practical standpoint, his method suffers from a number of very significant drawbacks. Foremost among these is the fact that it is highly infeasible to from microscopic thin channels or slots (of the type required by Tuckerman) into the backside of semiconductor material. Sawing thin slots into a weak, brittle, and hard material such as silicon often results in breakage and other irregularities. In addition, relying on integrally formed slots limits the height of the cooling channels to roughly the thickness of the silicon wafer. To overcome this latter limitation, high pressure is needed to force the coolant through the slots at a sufficiently high coolant flow rate so as to provide acceptable heat removal.

Moreover, it should be noted that the fabricaiton of precise microscopic (on the order of 50 microns wide or less) fins with high enough aspect ratios (depth versus width) is a difficult and complex process to carry out. A further problem arises out of the fact that engaging the semiconductor substrate with a hydrated coolant invariably subjects the silicon die to unwanted contaminants and impurities. Contamination of the substrate may ultimately comprise the reliability of the integrated circuit.

Therefore, what is needed is an heat exchanger which is more practical, less costly, and involves less complex manufacturing steps than the prior art approach described above. The heat exchanger should be capable of satisfying the heat removal requirements of high-speed switching circuitry in a simple, cost-effective manner—without jeopardizing the integrity of the device.

SUMMARY OF THE INVENTION

The present invention describes a microscopic laminar-flow heat exchanger and process for fabricating the same. The heat exchanger of the present invention is ideally suited for cooling a heat generating device such as a semiconductor integrated circuit.

The heat exchanger itself comprises a plurality of thin plates which have been laminated together to form a block. In one embodiment, the plates comprise thin copper foil strips each having a microscopic recessed portion etched into one face of the plate. These recessed portions are chemically etched to a shallow dimension on the order of 50 microns deep prior to lamination.

Either before or after the plates are laminated together, holes are cut through the plates at opposite sides of the recessed portions such that when the stack is laminated the holes align to form a pair of coolant distribution manifolds. Each of the manifolds is essentially a tube which penetrates into the block. The tubes are connected via the plurality of microscopic channels formed from the recessed portions during the lamination process. Optimizing the thickness of the channels and the coolant flow rate therewin allows the block to function as a highly efficient heat exchanger. The semiconductor die is simply placed or bonded onto the surface of the block to effectuate heat removal.

BRIEF DESCRIPTION OF THE DRAWINGS

The invention and objects and features thereof will be more readily apparent from the following detailed description and appended claims when taken with the drawings, in which:

FIG. 1 is a perspective view of a thin plate, including a recessed portion, employed in conjunction with the present invention.

FIG. 2 is a perspective view of a plurality of individual plates as shown in FIG. 1 following lamination to form a block.

FIG. 3 illustrates a perspective view of the currently preferred embodiment of the present invention. The heat exchanger is shown being employed to remove heat from a semiconductor integrated circuit.

FIG. 4 is a side view of an individual plate used in an alternative embodiment of the present invention. The plate includes a baffled recessed portion.

FIG. 5A and 5B are cross-sectional views of an elongated ribbon utilized in an yet alternative embodiment of the present invention.

FIG. 6 is a top view of an alternative embodiment of the present invention wherein the ribbon of either FIG. 5A or 5B is wrapped spirally around itself to create a core.

FIG. 7 is a cross-sectional view taken from the core shown in FIG. 6.

DESCRIPTION OF THE PREFERRED EMBODIMENT(S)

An ultracompact laminar-flow heat exchanger for cooling a heat generating device is disclosed. In the following description, numerous specific details are set forth, such as particular dimensions, materials, structures, etc., in order to provide a thorough understanding of the present invention. However, it will be obvious to one skilled in the art that the invention may be practiced without these specific details. In other instances, well-known elements have not beens shown or described in detail to avoid unnecessarily obscuring the present invention.

With reference to FIG. 1, a perspective view is shown of a plate member 10. In accordance with the currently preferred embodiment, plate 10 comprises a thin copper foil having a face 11 into which has been etched a recessed region 12. The depth of recessed region 12 is preferably about 50 microns deep. Located within the recessed region 12 are holes 14 and 15, respectively positioned at opposite ends of the recessed area. The functional importance of recessed region 12 and holes 14 and 15 will be explained shortly.

Referring now to FIG. 2, there is illustrated a plurality of identical plates 10 which have been laminated together to form a block 18. Note that the location of holes 14 and 15 is consistent among plates 10 such that upon lamination, the alignment of holes 14 and 15 create a pair of tubes or manifolds formed through the interior of block 18.

The respective manifolds are connected together within the interior of block 18 by means of the microscopic channels formed by recessed regions 12. These connecting channels are created during the lamination process, wherein the face 11 of each of the respective plates 10 is pressed against the backside of its neighboring plate. The manifolds or tubes and the microscopic channels collectively provide a means for supplying and distributing a coolant fluid (e.g., water) throughout the interior of block 18.

Note that the manifolds do not extend completely through block 18. Instead, a special endplate 19 is utilized to contain the coolant fluid within the microscopic channels located within the interior of block 18. Endplate 19 also includes a recessed region 12 which is identical to that associated with plates 10; however, it does not inlcude holes 14 or 15. Thus, coolant fluid entering through the input manifold formed by holes 15 remains confined within block 18 as it flows through the microscopic channels, to be ultimately output through the output manifold formed by the alignment of holes 14.

It should be appreciated that lamination is only one of many possible methods of forming block 18 out of individual plates 10. For instance, plates 10 may be bonded, glued, soldered, or attached to one another by some alternative means during this stage of the manufacturing process. The only strict requirement is that when assembled, block 18 must be completely sealed for purposes of facilitating laminar coolant flow. That is, coolant fluid entering in through the input manifold should not leak or otherwise penetrate through to the exterior of block 18 as it flows through the microscopic channels on its way to the output manifold. Hence, a variety of well-known bonding or lamination means may be used for this purpose.

The choice of material which makes up plates 10 is also an optional consideration. Although a material having a high thermal conductivity such as copper is preferred, alternative materials may be better suited depending on the particular application, or on the type of heat generating device that the exchanger will be used in conjunction with. For example, in certain instances it may be desirable to manufacture plates 10 out a material having a thermal coefficient of expansion which closely matches that of the heat generating device to which it will be affixed.

A perspective view of the completely manufactured heat exchanger of the currently preferred embodiment of the present invention is shown in FIG. 3. As part of the manufacturing process, once plates 10 have been laminated together to form block 18 and endplate 19 has been attached, a cover plate 22 is likewise attached to the front side of block 18. Actually, the entire block, including end plate 19 and cover plate 22, may be assembled as part of a single lamination step. (Really, there is no significance to attaching cover plate 22 after block 18 and endplate 19 have been assembled).

Cover plate 22 essentially performs the same function as does endplate 19. It should be apparent that the purpose of cover plate 22 is to confine the flow of coolant within the microscopic channels to the interior of block 18. It performs this function in exactly the same way that endplate 19 does. Note, however, that there is no specific requirement for cover plate 22 to have a recessed portion 12, as was previously shown in connection with plates 10. But cover plate 22 must have corresponding holes 14 and 15 to allow attachment of respective pipes 25 and 24, as shown in FIG. 3.

Pipes 24 and 25 provide a means for distributing coolant uniformly throughout the interior of block 18. By way of example, in normal operation a coolant fluid such as water is pumped into input pipe 24 in alignment with holes 15 of individual plates 10. After the coolant enters block 18, the coolant engages the microscopic channels in a laminar flow to effectuate heat removal. The direction of coolant flow within these microscopic channels is shown in FIG. 3 by arrow 26. After traversing the length of the microscopic channels formed by the recessed regions 12, the coolant exits output pipe 25.

Depending on the type of system in which the heat exchanger of FIG. 3 is employed, output pipe 25 may be coupled to a refrigeration unit, of some similar means of re-cooling the fluid prior to delivering it back again to input pipe 24. Note that FIG. 3 further illustrates, by way of example, how a semiconductor die 20 may be affixed to the top of the heat exchanger during normal use. The integrated circuit fabricated on the surface of die 20 is represented in FIG. 3 by dashed line 21.

It is important to understand that in the embodiment of FIG. 3, pipes 24 and 25 typically penetrate no further than the thickness of cover plate 22. As a consequence—depending on the strength and durability requirements of the heat exchanger—cover plate 22 may be manufactured to be slightly thicker. Another option is to manufacture plate 22 out of a different, more rigid, material than the rest of the block.

Still another alternative is to manufacture the heat exchanger of FIG. 3 so that pipes 24 and 25 penetrate into the interior of block 18 in such a way as to provide added durability and strength. However, for this later case it should be understood that pipes 24 and 25 would have to include a single elongated slot in the pipe that aligns with the coolant channels, or alternatively, a series of macroscopic openings that would allow the coolant to pass from the manifold into the microscopic channels, and vice-a-versa. Of course, these openings must be aligned with the microscopic channels so that coolant flow could take place.

One key aspect of the present invention is the depth of recessed portions 12 formed on face 11 of plates 10. Ideally, the depth of the recessed region is made to be about twice the thickness of the thermal boundary layer associated with the particular coolant employed. This condition provides the maximum heat transfer from the plate surface to the coolant fluid, and allows the maximum number of channels to be formed per square inch.

Obviously, any increase in the channel density (i.e., the number of channels per square inch) within block 18 enhances the heat removing properties of the present invention. In the currently preferred embodiment, individual plates 10 are approximately 0.125 millimeters thick, whereas the recessed portions are etched to depth of approximately 50 microns using an ordinary etchant. Holes 14 and 15 may assume a variety of shapes and sizes, however, currently the diameter of these holes is approximately 8 millimeters.

Practitioners in the art will appreciate that the recessed portions may be formed by some means other than chemical etching. For example, where a relatively soft metal such as copper is utilized, the required recess feature may be simply stamped or pressed into the face of the plate. In still other embodiments, a series of flat plates in alternate position with a sequence of frame members may be utilized. For this latter case, the frame members themselves provide the required channel spacing between the flat plates. Other embodiments which achieve the same purpose of forming microscopic channels within a thermally conductive block are also possible. Such alternative embodiments are considered to be well within the spirit and scope of the present invention.

As an example of the multifarious alternations which may be made upon the basic invention, FIG. 4 shows one way in which turbulence may be introduced into the coolant flow within the interior of the heat exchanger. FIG. 4 represents a side view of a plate 10 similar to the ones previously discussed. As before, plate 10 includes a recessed portion 12, a face 11 and holes 14 and 15. But the plate of FIG. 4 further includes finger members 31 which extend into the recessed region 12. Yet finger members 31 remain co-planar with face 11. For instance, if recessed region 12 are formed by chemical etching, finger members 31 may be easily fabricated by proper patterning of the recessed region prior to the etching process.

The purpose of finger members 31 is to disrupt the normal laminar flow of coolant through the microscopic channels. As can be seen by the sinuous arrow passing through recessed region 12 of FIG. 4, the coolant is forced to flow a greater distance before reaching the output manifold region. The increased distance which the coolant fluid must traverse—coupled with the effects of an intentionally induced turbulence—will provide more efficient heat transfer within the heat exchanger for certain embodiments.

The nature of the actual improvement in heat transfer efficiency will depend on such factors as the type of material comprising plates 10, the type of coolant fluid, the thickness of the channels, the velocity of the coolant, etc. The specific nature of the baffling members (e.g., the shape, spacing, length, etc., of fingers 31) will also influence the efficiency of the heat removal process. Hence, each of these factors is preferably optimized to yield the most efficacious heat transfer mechanism possible. (Note that the baffling pattern shown in FIG. 4 is for illustration purposes only—it being appreciated that numerous other patterns and configurations are available to one of the ordinary skill in the art.)

FIGS. 5 through 7 illustrate an alternative embodiment of the present invention in which coolant flows radially throughout a circular core member. Rather than laminating a plurality of distinct plates together to form a block, the alternative embodiment of FIGS. 5–7 is comprised of a single, thermally conductive ribbon which has been wrapped spirally against itself to form a circular core.

FIGS. 5A and 5B show cross sectional views of two possible ribbons 34 and 36, respectively. Ribbon 34 has a cross-sectional view which resembles an I-bar, while ribbon 36 assumes the shape of a three-sided rectangle. Regions 35 and 37 on either side of respective ribbons 34 and 36 correspond to the recessed portion 12 of the previously discussed embodiments. This means that regions 35 and 37 may be formed by such processes as chemical etching, stamping, etc.

Once ribbon 34 (or 36) has been spirally wrapped around against itself and laminated into a single core 40, regions 35 (or 37) define a spiral microscopic channel which continuously winds throughout the center of core 40 (see FIG. 6). The formation of these microscopic channels is depicted by the radial cross-sectional cut view of core 40 appearing in FIG. 7.

By viewing FIG. 7, one can easily see how the microscopic channel regions 35 are formed as a result of continuously wrapping ribbon 34 against itself. The end effect is as if a series of I-bar members were stacked against one another, side-to-side. Note that within core 40, the side surfaces 46 of ribbon 34 abut each other in the same manner that plates 10 are joined together to form the microscopic channels within block 18. Just as was the case in forming block 18, core 40 may be formed by any sealing process of ribbon 34 which confines the coolant flow within channels 35.

Referring back to FIG. 6, a top view of core 40 shows two holes 46 and 47 penetrating core 40 from opposite ends. These holes provide the coolant distribution manifold means for the heat exchanger of FIG. 6. In other words, tubes 41 and 42 are attached to the ends of holes 46 and 47, respectively, so the coolant fluid may pass through the microscopic channels radially about core 40 as shown by arrows 44.

It is crucial to understand that holes 46 and 47 do not extend fully through to the center of core 40. Their penetration must stop short of the center to insure that coolant flow takes place radially through the microscopic channels—and not directly (i.e., bypassing the channels) from the input to the output manifold tubes. Also note that the embodiment of FIG. 6 has similar requirements for sealing the ends of core 40. In other words, the two ends. 38 and 39 of ribbon 34, must be sealed in some manner to confine the coolant fluid within core 40.

FIG. 5 shows an alternative ribbon 36 which, instead of including a pair of recessed regions, has a single recessed region 37. Optimally, the depth of region 37 is approximately equal to twice the thermal boundary layer thickness (twice the depth of recessed portion 35). During manufacturing, ribbon 36 is spirally wrapped in the same way as described previously in connection with ribbon 34 of FIG. 5A. However, due to its different cross-sectional shape, the core formed by ribbon 36 may require a different sealing means at ends 38 and 39. Laminar coolant flow in core 40 is identical for either of ribbons 34 or 36.

I claim:

1. A heat exchanger for cooling a heat generating device comprising:
    a plurality of plates each having a microscopic recessed portion along at least one face, said plates being laminated together to form a block wherein a corresponding plurality of enclosed microscopic slots are formed by the recessed portions of said plates within said block;
    coolant manifold means for flowing a coolant fluid through said enclosed slots, said device being cooled when placed in contact with said block.

2. The heat exchanger of claim 1 wherein said block includes a front face having an exposed recessed portion and wherein said heat exchanger further comprises a cover plate for sealing said exposed recessed portion along said front face.

3. The heat exchanger of claim 2 wherein said plates comprise a material having a high thermal conductivity.

4. The heat exchanger of claim 3 wherein said plates comprise copper.

5. The heat exchanger of claim 1 wherein said coolant manifold means comprises:
    an intake manifold for applying said coolant to a first side of said enclosed microscopic slots;
    an exhaust manifold for removing said coolant from a second side of said slots; and
    means for pumping said coolant through said slots in a direction from said intake manifold to said exhaust manifold.

6. The heat exchanger of claim 5 wherein said intake and exhaust manifolds each comprise a pile fitted to a hole in said block, said hole providing an opening to said enclosed microscopic slots.

7. The heat exchanger of claim 6 wherein the depth of said recessed portion of each of said plates is approximately twice the thermal boundary layer thickness.

8. The heat exchanger of claim 7 wherein said coolant is distributed uniformly through said slots.

9. The heat exchange of claim 8 further comprising baffling means for altering the flow of said coolant within said slots to provide more efficient heat transfer between said coolant and said block.

10. The heat exchanger of claim 8 wherein said recessed portions are approximately 50 microns deep.

11. The heat exchanger of claim 5 wherein said recessed portions are centrally located along said at least one face of said plates.

12. The heat exchanger of claim 11 wherein said heat generating device comprises a semiconductor substrate upon which is fabricated an integrated circuit.

13. A heat exchanger for cooling a heat generating device comprising:
    a core element containing a plurality of microscopic channels enclosed therein, said core element comprising a plurality of laminated plates, each plate having a microscopic recessed portion along at least one face, wherein the recessed portions of said plates correspond to said plurality of enclosed microscopic channels; and
    a coolant manifold means for flowing a coolant fluid through said enclosed microscopic channels, said device being cooled when placed in contact with said core element.

14. The heat exchanger of 13 wherein said core element comprises a material having a high thermal conductivity.

15. The heat exchanger of claim 14 wherein said core element comprises copper.

16. The heat exchanger of claim 14 wherein said coolant manifold means comprises:
    an intake manifold for applying said coolant to a first side of said microscopic channels;
    an exhaust manifold for removing said coolant from the second side of said channels; and
    a means for pumping said coolant through said channels in a direction from said intake manifold to said exhaust manifold.

17. The heat exchanger of claim 16 wherein said intake and exhaust manifolds each comprise a tube fitted within a hole in said core element which provides an opening to said microscopic channels.

18. The heat exchanger of claim 17 wherein the width of each of said channels is approximately twice the thermal boundary layer thickness.

19. The heat exchanger of claim 18 further comprising baffling means for altering the flow of said coolant in said slots thereby providing a more efficient heat transfer between said coolant and said core element.

20. The heat exchanger of claim 19 wherein said recessed portions are approximately 50 microns deep.

21. The heat exchanger of claim 19 wherein said heat generating device comprises a semiconductor substrate upon which is fabricated an integrated circuit.

* * * * *